「US007508662B2」

United States Patent
Chang (10) Patent No.: US 7,508,662 B2
(45) Date of Patent: Mar. 24, 2009

(54) HANDLE ARRANGEMENT WITH INTEGRATED HEAT PIPE

(75) Inventor: Ray Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 379 days.

(21) Appl. No.: 11/398,165

(22) Filed: Apr. 5, 2006

(65) Prior Publication Data
US 2007/0235166 A1 Oct. 11, 2007

(51) Int. Cl.
*H05K 7/20* (2006.01)
*H01L 23/36* (2006.01)

(52) U.S. Cl. ........... 361/687; 361/683; 361/681; 361/700; 165/80.3; 165/80.4; 165/104.33; 165/185

(58) Field of Classification Search ........... 361/681, 361/683, 687, 699, 700, 707; 165/80.3, 80.4, 165/104.33, 104.21, 185; 62/259.2; 463/19; 16/114.1, 445, 443, 444, 446, 430, 431
See application file for complete search history.

(56) References Cited

U.S. PATENT DOCUMENTS

| | | | | |
|---|---|---|---|---|
| 5,293,300 A * | 3/1994 | Leung | ......... | 361/683 |
| 5,375,076 A * | 12/1994 | Goodrich et al. | ......... | 361/681 |
| 5,596,482 A * | 1/1997 | Horikoshi | ......... | 361/683 |
| 5,721,668 A * | 2/1998 | Barrus et al. | ......... | 361/683 |
| 5,796,581 A * | 8/1998 | Mok | ......... | 361/687 |
| 5,822,187 A * | 10/1998 | Garner et al. | ......... | 361/687 |
| 5,826,645 A * | 10/1998 | Meyer et al. | ......... | 165/104.33 |
| 6,017,106 A * | 1/2000 | Adams et al. | ......... | 312/223.2 |
| 6,069,791 A * | 5/2000 | Goto et al. | ......... | 361/687 |
| 6,097,596 A * | 8/2000 | Cipolla et al. | ......... | 361/687 |
| 6,185,102 B1 * | 2/2001 | Shou et al. | ......... | 361/704 |
| 7,042,729 B2 * | 5/2006 | Dias et al. | ......... | 361/708 |
| 7,118,477 B1 * | 10/2006 | Kellen | ......... | 463/19 |

FOREIGN PATENT DOCUMENTS

JP 2000165078 A * 6/2000

* cited by examiner

*Primary Examiner*—Michael V Datskovskiy
(74) *Attorney, Agent, or Firm*—I P Strategy Group, P.C.

(57) ABSTRACT

Handle arrangements having an integrated heat pipe for use with a portable electronic device are presented including: a heat pipe, the heat pipe configured with a heat receiving portion, a heat conducting portion, and a heat dissipating portion; a handle disposed along an edge of the portable electronic device, the handle including a handle surface configured to enclose at least the heat dissipating portion, wherein the handle surface is vented to allow air flow across at least the heat dissipating portion; an attachment housing for attaching the handle with the portable electronic device, the attachment housing configured to enclose the heat conducting portion; and a processing unit having a contact surface, the contact surface in thermal communication with the heat receiving portion wherein the portable electronic device is configured to enclose the heat receiving portion.

20 Claims, 6 Drawing Sheets

HANDLE ARRANGEMENT WITH INTEGRATED HEAT PIPE

BACKGROUND

As portable electronic device designs become more compact, managing thermal loads in integrated circuits (e.g. processing units) becomes more challenging. One reason for this challenge is that high powered portable devices can generate significant amounts of waste heat energy over a relatively compact area. As such, damage due to heat cycling may cause collateral damage to components in close proximity to heat generators. In conventional solutions, fans may be utilized in coordination with a heat sink to dissipate generated waste heat. In some examples, where fans are utilized to cool components, battery life may be significantly lowered.

Figure 1:
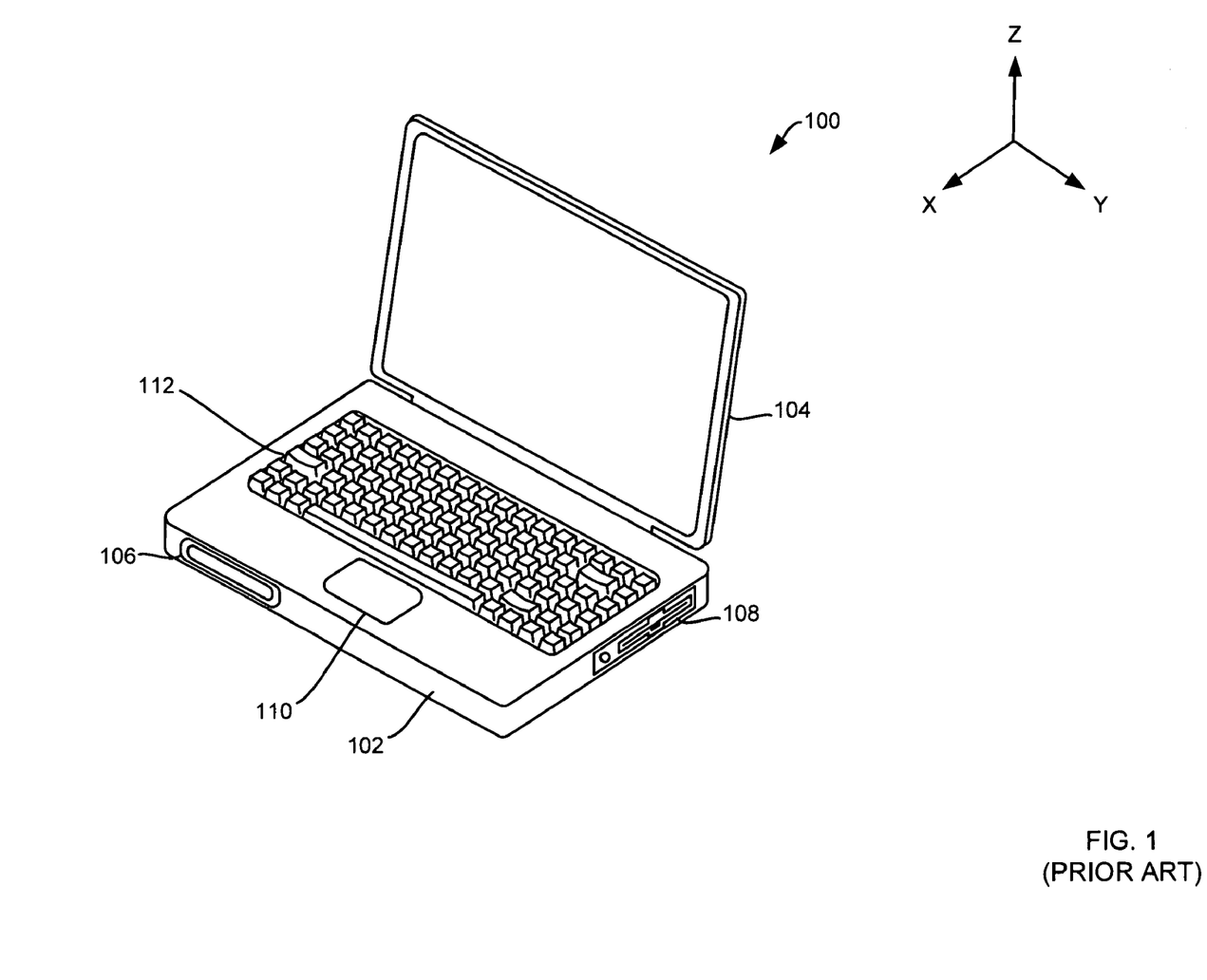
FIG. 1 is an illustrative representation of a prior art portable computing system.

In one example, FIG. 1 is an illustrative representation of a prior art portable computing system 100. Portable computing systems may have any number of components including a screen 104, a removable media drive 108, a fixed media drive 106, a keyboard 112, and a track pad 110. As illustrated, many components may be housed in a base 102. Typically, as the number and type of components increase, power consumption increases. Because power consumption is directly related to an increase in thermal loading, managing thermal loads becomes a more critical in new system designs. Thus, many cooling systems have been developed to manage thermal loads in portable electronic systems.

Figure 2:
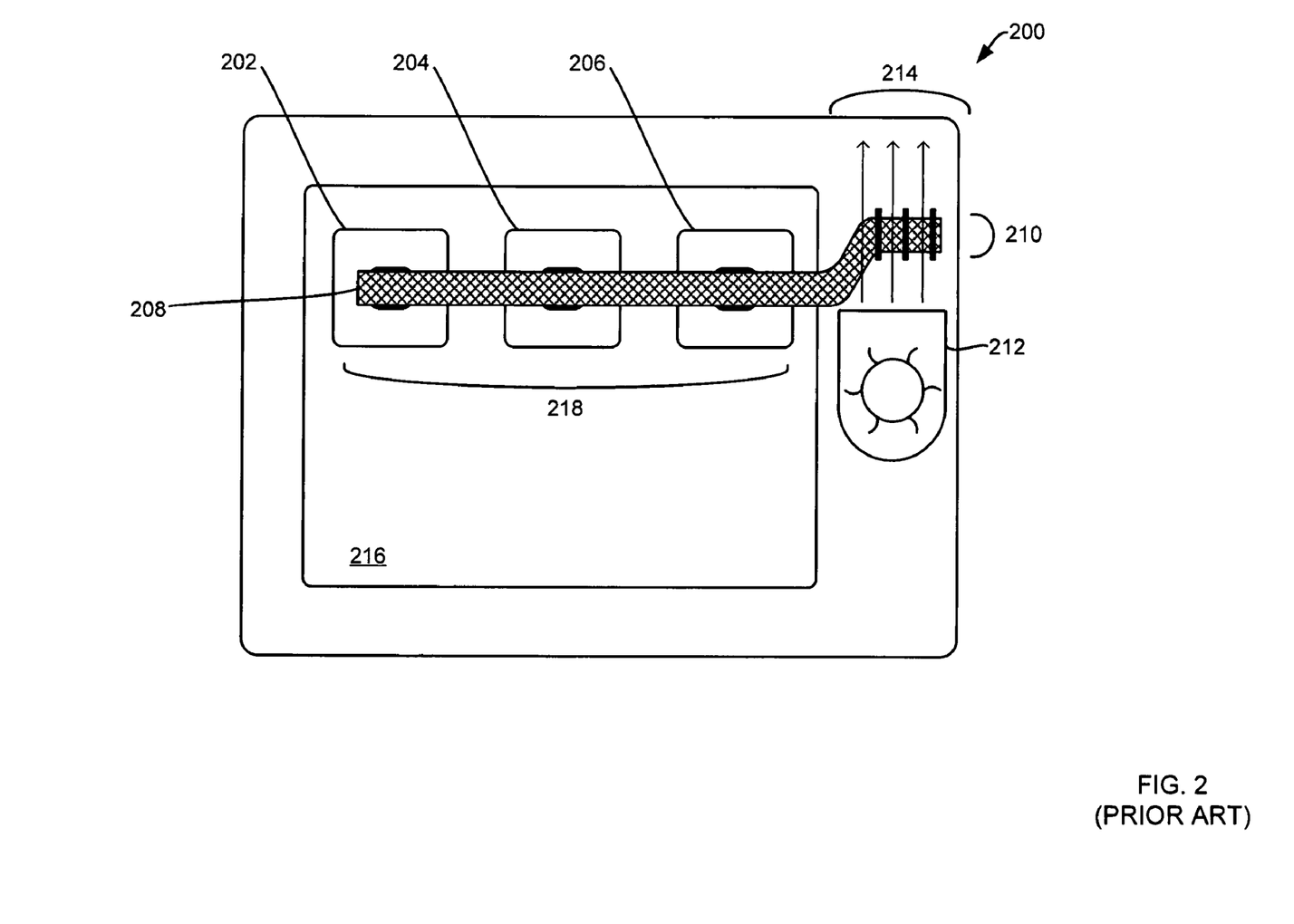
FIG. 2 is an illustrative representation of a prior art cooling system.

FIG. 2 is an illustrative representation of a prior art cooling system 200, which may be utilized with a portable computing system 100 (see FIG. 1). As illustrated, any number of processing units 202, 204, and 206 mounted on board 216 may generate waste heat. As noted above, integrated circuits (e.g. processing units 202, 204, and 206) may generate significant waste heat energy. In this example, a heat pipe 208 may be configured to receive waste heat from processing units 202, 204, and 206. As may be appreciated, heat pipes may be utilized for a wide variety of applications covering the complete spectrum of heat transfer applications. Heat pipes are ideal for applications where heat must be transferred with a minimum thermal gradient to relocate a sink to a remote location. A heat pipe is an evacuated vessel, typically circular in cross-section, which may be filled with a quantity of a working fluid such as water or methanol. Heat pipes are passive and may be used to transfer heat from a heat source to a heat sink with minimal temperature gradients. In this example, heat pipe 208 is configured to transfer heat from heat receiving portion 218 to heat dissipating portion 210. A fan 212 may then be employed to force air across heat dissipation portion 210 as illustrated by lines 214. In this manner heat may be transferred from processing units 202, 204, and 206 to the environment.

Although conventional methods as illustrated may be effective, as noted above, power requirements for fan usage may, in some instances significantly reduce battery life making such a solution somewhat undesirable. Furthermore, use of a fan may, in some examples, contribute to an undesirable increase in noise level. Therefore, handle arrangements with an integrated heat pipe are presented herein.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented below.

Therefore, handle arrangements having an integrated heat pipe for use with a portable electronic device are presented including: a heat pipe, the heat pipe configured with a heat receiving portion, a heat conducting portion, and a heat dissipating portion; a handle disposed along an edge of the portable electronic device, the handle including a handle surface configured to enclose at least the heat dissipating portion, wherein the handle surface is vented to allow air flow across at least the heat dissipating portion; an attachment housing for attaching the handle with the portable electronic device, the attachment housing configured to enclose the heat conducting portion; and a processing unit having a contact surface, the contact surface in thermal communication with the heat receiving portion wherein the portable electronic device is configured to enclose the heat receiving portion. In some embodiments, the venting is: perforated, drilled, punched, slotted, and louvered. In some embodiments, the attachment housing is rotatably connected with the handle and the portable electronic device such that the portable electronic device may be tilted from a planar surface by the handle. In some embodiments, the arrangement further comprises a heat sink configured to rotatably receive the heat receiving portion, the heat pipe in thermal contact with the heat receiving portion and the contact surface.

In other embodiments, handle arrangements with an integrated heat pipe for use with a portable electronic device are presented including: heat pipe means, the heat pipe means configured with a heat receiving portion, a heat conducting portion, and a heat dissipating portion; handle means disposed along an edge of the portable electronic device, the handle means including a handle surface configured to enclose the heat dissipating portion, wherein the handle surface is vented to allow air flow across the heat dissipating portion; attachment housing means for attaching the handle with the portable electronic device, the attachment housing means configured to enclose the heat conducting portion; and a processing unit having a contact surface, the contact surface in thermal communication with the heat receiving portion wherein the portable electronic device is configured to enclose the heat receiving portion. In some embodiments, the attachment housing means is rotatably connected with the handle and the portable electronic device such that the portable electronic device may be tilted from a planar surface by the handle.

In other embodiments, a passive cooling system integrated with an articulating handle for use with a portable computing system is presented including: a heat pipe, the heat pipe configured with a heat receiving portion, a heat conducting portion, and a heat dissipating portion; a heat sink configured to rotatably receive the heat receiving portion, the heat pipe in thermal contact with the heat receiving portion; a portable computing system configured with a number of processing units each having a contact surface, the contact surface in thermal communication with the heat sink wherein the portable computing system is configured to enclose the heat receiving portion; and an attachment housing for rotatably attaching the articulating handle with the portable electronic device, the attachment housing configured to enclose the heat conducting portion wherein the articulating handle is disposed along an edge of the portable electronic device, the articulating handle including a handle surface configured to enclose the heat dissipating portion, wherein the handle surface is vented to allow air flow across at least the heat dissipating portion and the portable computing system may be tilted from a planar surface by the articulating handle.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 3A:
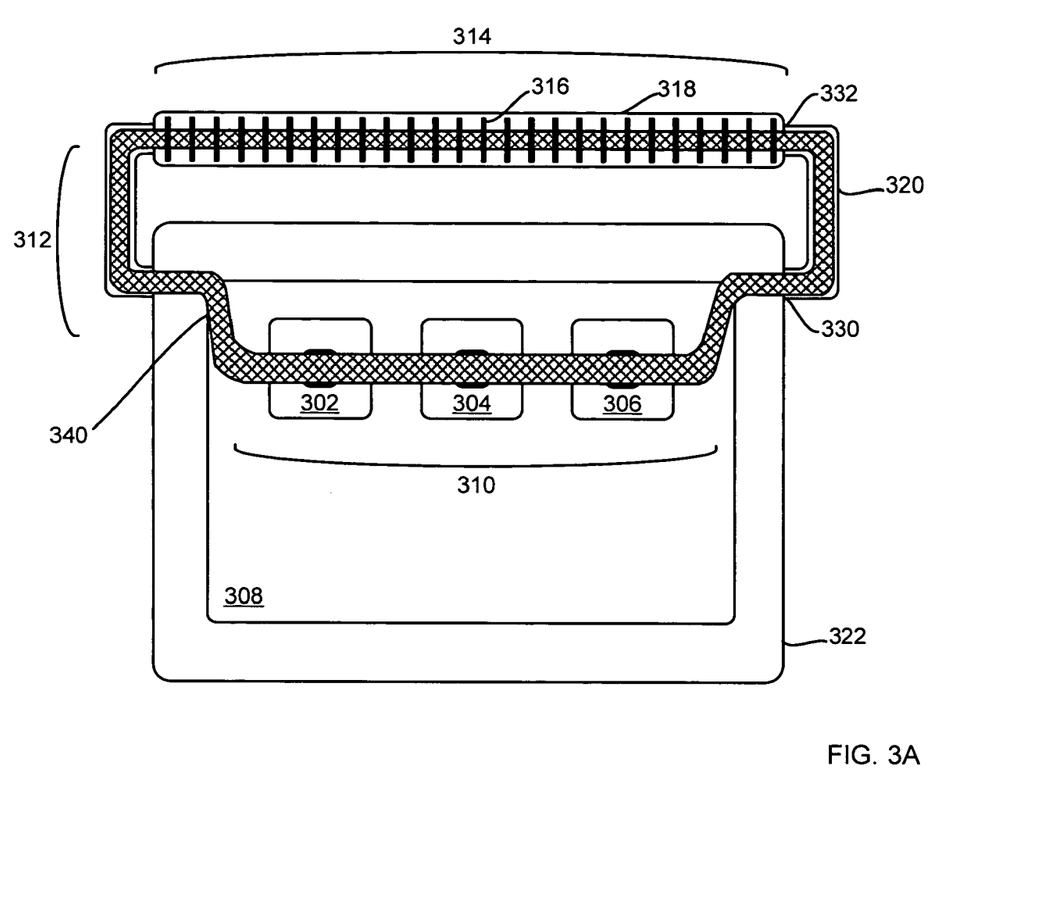
FIGS. 3A-B are illustrative representations of a cooling system for a number of processing components in accordance with an embodiment of the present invention.
Figure 3B:
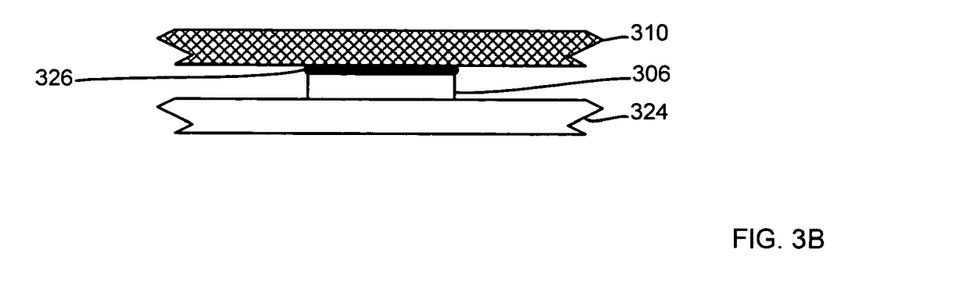

FIGS. 3A-B are illustrative representations of a cooling system 300 for a number of processing components in accordance with an embodiment of the present invention. As illustrated in FIG. 3A, a portable electronics device 322 having a main logic board 308 may include components needing to be cooled with embodiments described herein. As can be appreciated, integrated circuits, in some applications, may generate significant waste heat energy. Some examples of integrated circuits include, but are not limited to a central processing unit, a graphics processing unit, a north bridge, and a south bridge. Typically, integrated circuits exceeding approximately two watts of power consumption may require some cooling. Thus, as illustrated, embodiments may cool any number of processing units 302, 304, and 306. Although three processing units are illustrated, one or more processing units may be cooled using embodiments herein without departing from the present invention.

A heat pipe 340 having a heat receiving portion 310, a heat conducting portion 312, and a heat dissipating portion 314 is illustrated. Heat pipes transfer heat by the evaporation and condensation of a working fluid such as water or methanol. A heat pipe is a vacuum tight vessel which is evacuated and partially back-filled with a working fluid. As heat is input at heat receiving portion 310, fluid is vaporized, creating a pressure gradient in the pipe. This pressure gradient forces the vapor to flow along heat conducting portion 312 to heat dissipating portion 314 where it condenses, giving up its latent heat of evaporization. In some examples, a fin stack 316, may be utilized to increase heat dissipation efficiency. The working fluid is then returned to heat receiving portion 310 by capillary forces developed in a porous wick structure enclosed within the pipe or, in some examples, by gravity.

Embodiments described herein may be configured to protect heat pipe 340 from damage. As such, handle 318 may be configured to enclose heat dissipating portion 314. Example handle arrangements will be discussed in further detail below for FIGS. 4-5. Further, attachment housing 320 may be configured to enclose heat conducting portion 312. In some embodiments, attachment housing 320 may be connected with handle 318 and portable electronic device 322 by articulating joints 330 and 332. Other attachment configurations will be discussed in further detail below for FIG. 6. Finally, portable electronic device 322 may be configured to enclose heat receiving portion 310.

Referring to FIG. 3B, a partial side view of heat receiving portion 310 in contact with a processing unit 306, which is mounted on substrate 324. In some embodiments, a thermal transfer compound 326 may be utilized to more efficiently transfer thermal loads. As may be appreciated, although a processing unit and heat sink (e.g. heat receiving portion 310) may appear to mate along flat surfaces, microscopic irregularities may inhibit effective heat transfer. Thus, thermal transfer compounds may be utilized to fill those irregularities and increase thermal transfer efficiency. As may be appreciated, any thermal transfer compound well-known in the art may be utilized without departing from the present invention.

Figure 4:
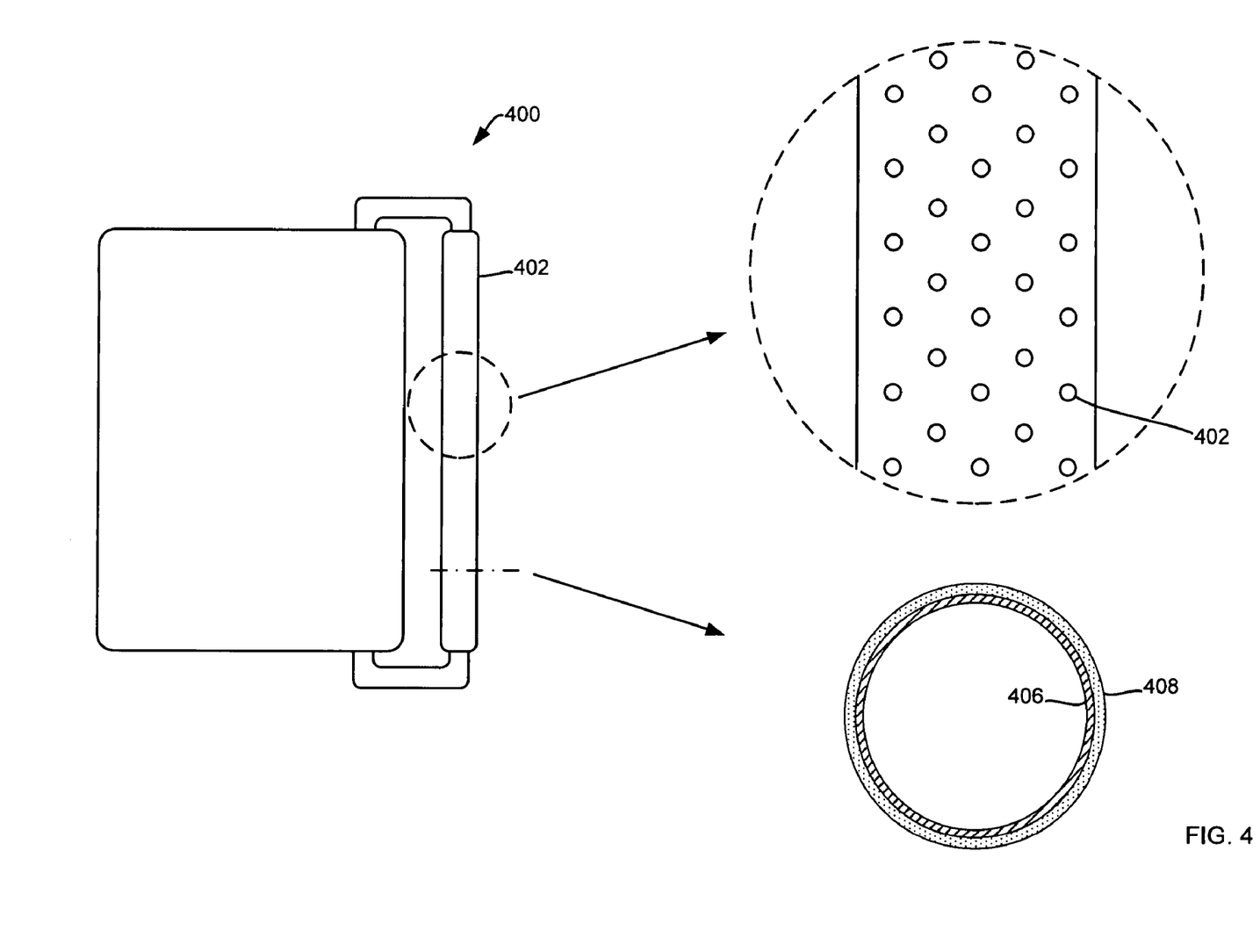
FIG. 4 is an illustrative representation of a portable electronic device including a handle arrangement in accordance with an embodiment of the present invention.

FIG. 4 is an illustrative representation of a portable electronic device 400 including a handle arrangement 402 in accordance with an embodiment of the present invention. As noted above, handle arrangement 402 may be configured to enclose a heat dissipating portion of a heat pipe. Thus, handle arrangement 402 may be vented in some manner to provide for more efficient heat dissipation. Any manner of vent configurations may be utilized including, for example, perforated, drilled, punched, slotted, and louvered without departing from the present invention. Vent placement and number may be selected to optimize air flow while maintaining sufficient structural integrity. It may be appreciated that a maximum number of vents is generally desirable in a passive system such as those described in order to assure sufficient heat dissipation.

In some embodiments, a texture layer 408 may be bonded to handle surface 406. Because portable electronic devices may be, in some examples, bulky or heavy, a textured handle may provide an improved gripping surface. In some examples, texture layer 408 may include a rubberized conformal coating. In other examples, a coating may include, for example, a grit agent for providing an improved gripping surface. As may be appreciated, any selected texture layer must be resilient to some level of heat cycling in order to provide a durable finish. Textured layers are generally well-known in the art and may be utilized without limitation without departing from the present invention.

Figure 5:
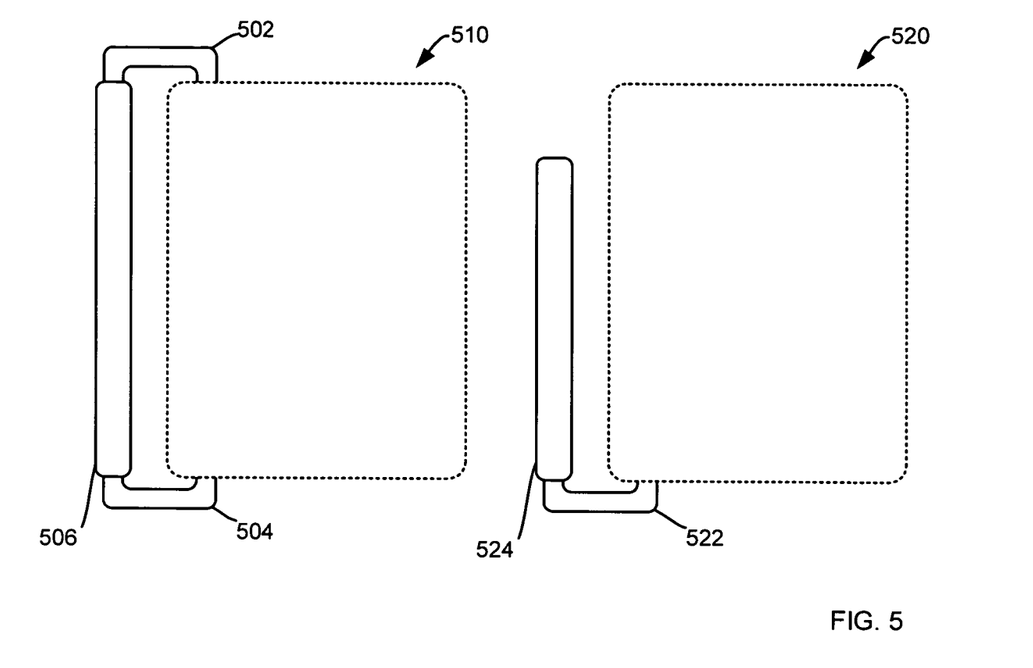
FIG. 5 is an illustrative representation of a number of handle configurations for use with a portable electronic device in accordance with embodiments of the present invention.

FIG. 5 is an illustrative representation of a number of handle configurations for use with a portable electronic device in accordance with embodiments of the present invention. A first configuration 510 includes two attachment housings 502 and 504 for attaching handle 506. As noted above for FIG. 3, attachment housings may be configured to enclose heat conducting portion. Paired attachment housings may be useful in applications requiring a longer heat pipe circuit, such as when multiple processing units generating waste heat are utilized. In some applications, however, a smaller heat pipe circuit may be utilized. Thus, in a second configuration 520, a single attachment housing 522 may be utilized for attaching handle 524. It may be appreciated that heat pipe circuits need not be double ended such as illustrated in FIG. 3A. Thus, a heat dissipating portion may have a closed end making single attachment housing feasible. Further, as illustrated, handles are configured disposed along a back edge. However, handles may be configured on a side edge or front edge of a portable electronic device in some embodiments.

Figure 6:
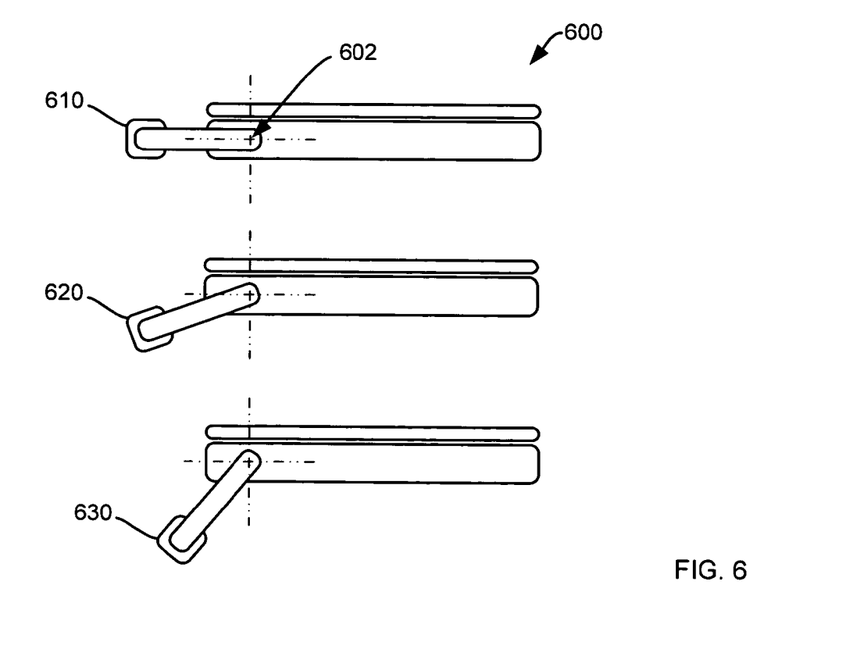
FIG. 6 is an illustrative representation of an articulating handle arrangement in accordance with an embodiment of the present invention.

FIG. 6 is an illustrative representation of an articulating handle arrangement 600 in accordance with an embodiment of the present invention. As noted above, an attachment housing may be connected with a handle and portable electronic device by articulating joints. Thus, handle 610 may be configured to rotatably articulate about point 602. As illustrated, handle 610 is in a first position. In some embodiments, a locking mechanism may be employed to temporarily affix handle 610 in a first position. Further illustrated is handle 620 in a second position. In some embodiments, a locking mechanism may be employed to temporarily affix handle 620 in a second position. Still further illustrated is handle 630 in a third position. In some embodiments, a locking mechanism may be employed to temporarily affix handle 630 in a third position. As may be appreciated, an articulating handle may be utilized to tilt a portable electronic device to a more desirable position thus reducing ergonomic strain or screen glare in some examples. Tilting features are particularly useful in applications where the portable electronic device is a computing device. Articulating joints are generally well-known in the art and may be utilized in any manner without departing from the present invention.

Figure 7:
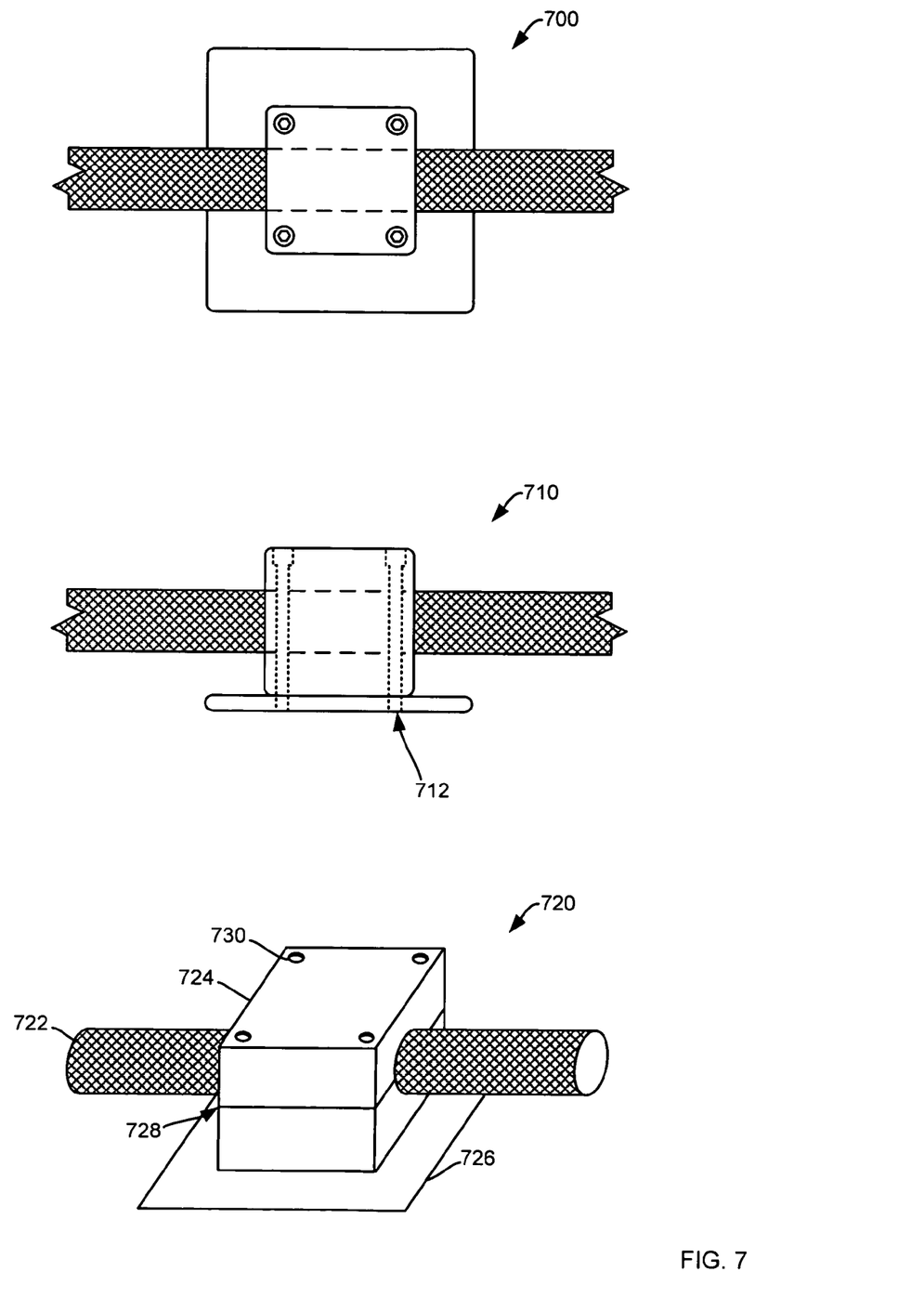
FIG. 7 includes various views of illustrative representations of an attachment to a substrate that provides for heat pipe articulation in accordance with embodiments of the present invention.

FIG. 7 includes various views of illustrative representations of an attachment to a substrate that provides for heat pipe articulation in accordance with embodiments of the present invention. Several views are provided for clarity's sake. View 700 is an illustrative top view of an embodiment of the present invention. View 710 is an illustrative front view of an embodiment of the present invention. View 720 is an illustrative orthogonal view of an embodiment of the present invention. As may be appreciated, in embodiments employing an articulating joint such as those presented above for FIGS. 5-6, additional configurations may be necessary. As illustrated, heat pipe 722 may be captured by a heat sink 724. Because heat pipes require a constant volume, a flexible connection may not generally be used in an articulating joint. Thus, a heat pipe that is configured as a rigid pipe must be configured with a mechanism for rotation. Heat sink 724 serves this purpose while maintaining thermal contact with a processing unit that requires cooling. Heat sink 724 may be mounted through substrate 726 (see also through-hole 712). In some embodiments, mounting heat sink 724 through substrate 726 allows rotational forces to be transmitted to frame or chassis so that damage to a processing unit may be avoided.

Heat sink 724 and heat pipe 722 may further include a thermal transfer compound to more efficiently transfer thermal loads. As may be appreciated, although a heat sink surface and a heat pipe surface may appear to mate along flat surfaces, microscopic irregularities may inhibit effective heat transfer. Thus, thermal transfer compounds may be utilized to fill those irregularities and increase thermal transfer efficiency. As may be appreciated, any thermal transfer compound well-known in the art may be utilized without departing from the present invention. Still further, a heat sink gap 728 may be utilized in coordination with bolts 730 to provide sufficient clamping force to ensure thermal conductivity. That is, bolts 730 may be tightened with sufficient torque to provide good contact while allowing heat pipe 722 to rotate along an articulation point. As may be appreciated, illustrations are not necessarily to scale, but are provided for clarity sake only. No implied limitations as to size and shape are intended.

It may be appreciated that some of the advantages associated with the embodiments described herein are lower power consumption due to elimination of an active cooling system utilizing a fan; lower noise due to elimination of a fan; higher cooling efficiency due to a longer heat dissipating portion and associated fin stack; better carrying modes due to the handle and various embodiments described herein; and better ergonomic positioning due to an articulating function built into the handle and attachment housing.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A handle arrangement with an integrated heat pipe for use with a portable electronic device, the arrangement comprising:
    a heat pipe, the heat pipe configured with a heat receiving portion, a heat conducting portion, and a heat dissipating portion;
    a handle disposed along an edge of the portable electronic device, the handle including a handle surface configured to enclose at least the heat dissipating portion, wherein the handle surface is vented to allow air flow across at least the heat dissipating portion;
    a texture layer bonded to the handle surface for providing a gripping surface, the texture layer configured to enclose at least a portion of the heat dissipating portion; and
    at least one attachment housing for attaching the handle with the portable electronic device, the at least one attachment housing configured to enclose at least the heat conducting portion.

2. The arrangement of claim 1 wherein the venting includes at least one of perforated venting, drilled venting, punched venting, slotted venting, and louvered venting.

3. The arrangement of claim 1 wherein the heat receiving portion is configured to contact at least a first processing unit of the portable electronic device through a first thermal transfer compound.

4. The arrangement of claim 3 wherein the heat receiving portion is further configured to contact at least a second processing unit of the portable electronic device through a second thermal transfer compound.

5. The arrangement of claim 1 wherein the at least one attachment housing is rotatably connected with the handle and the portable electronic device such that the portable electronic device may be tilted from a planar surface by the handle.

6. The arrangement of claim 5 further comprising a heat sink configured to rotatably receive the heat receiving portion, the heat pipe in thermal contact with the heat receiving portion and the contact surface.

7. The arrangement of claim 1 further comprising a thermal transfer compound, wherein the heat receiving portion is configured to contact a processing unit of the portable electronic device through the thermal transfer compound.

8. The arrangement of claim 1 wherein the edge is selected from the group consisting of: a front edge, a side edge, and back edge.

9. The arrangement of claim 1 wherein the portable electronic device is a computing device.

10. A handle arrangement with an integrated heat pipe for use with a portable electronic device, the arrangement comprising:
- heat pipe means, the heat pipe means configured with a heat receiving portion, a heat conducting portion, and a heat dissipating portion;
- handle means disposed along an edge of the portable electronic device, the handle means including a handle surface configured to enclose at least the heat dissipating portion, wherein the handle surface is vented to allow air flow across at least the heat dissipating portion;
- a texture layer bonded to the handle surface for providing a gripping surface, the texture layer configured to enclose at least a portion of the heat dissipating portion; and
- attachment housing means for attaching the handle with the portable electronic device, the attachment housing means configured to enclose at least the heat conducting portion.

11. The arrangement of claim 10 wherein the attachment housing means is rotatably connected with the handle and the portable electronic device such that the portable electronic device may be tilted from a planar surface by the handle.

12. The arrangement of claim 10 further comprising a thermal transfer compound, wherein the heat receiving portion is configured to contact a processing unit of the portable electronic device through the thermal transfer compound.

13. The arrangement of claim 10 wherein the edge is selected from the group consisting of: a front edge, a side edge, and back edge.

14. The arrangement of claim 10 wherein the portable electronic device is a computing device.

15. A cooling system for use with a portable computing system, the cooling system comprising:
- a heat pipe, the heat pipe configured with a heat receiving portion, a heat conducting portion, and a heat dissipating portion;
- a heat sink configured to rotatably receive the heat receiving portion, the heat pipe in thermal contact with the heat receiving portion;
- an articulating handle disposed along an edge of the portable electronic device, the articulating handle including a handle surface configured to enclose at least the heat dissipating portion, wherein the handle surface is configured to tilt the portable computing system from a planar surface; and
- a texture layer bonded to the handle surface for providing a gripping surface, the texture layer configured to enclose at least a portion of the heat dissipating portion.

16. The cooling system of claim 15 wherein the heat receiving portion is configured to contact at least a first processing unit of the portable electronic device through a first thermal transfer compound.

17. The cooling system of claim 16 wherein the heat receiving portion is further configured to contact at least a second processing unit of the portable electronic device through a second thermal transfer compound.

18. The cooling system of claim 17 wherein the first processing unit is disposed on a logic board, and the second processing unit is disposed on the logic board.

19. The cooling system of claim 15 wherein the edge is selected from the group consisting of: a front edge, a side edge, and back edge.

20. The arrangement of claim 15 further comprising a fin slack disposed at the heat dissipating portion for increasing heat dissipation efficiency, wherein the texture layer is configured to enclose at least a portion of the fin stack.

* * * * *